United States Patent
Kobayashi

(10) Patent No.: US 7,918,017 B2
(45) Date of Patent: Apr. 5, 2011

(54) ELECTRONIC COMPONENT TAKING OUT APPARATUS

(75) Inventor: Kazuhiro Kobayashi, Iwata (JP)

(73) Assignee: Yamaha Hatsudoki Kabushiki Kaisha (JP)

( * ) Notice: Subject to any disclaimer, the term of this patent is extended or adjusted under 35 U.S.C. 154(b) by 16 days.

(21) Appl. No.: 12/439,566

(22) PCT Filed: Aug. 28, 2007

(86) PCT No.: PCT/JP2007/066611
§ 371 (c)(1),
(2), (4) Date: Mar. 2, 2009

(87) PCT Pub. No.: WO2008/026565
PCT Pub. Date: Mar. 6, 2008

(65) Prior Publication Data
US 2010/0083488 A1   Apr. 8, 2010

(30) Foreign Application Priority Data

Aug. 29, 2006 (JP) ................................. 2006-232225

(51) Int. Cl.
*H05K 3/30* (2006.01)
*G01B 11/14* (2006.01)
(52) U.S. Cl. ............... 29/833; 29/712; 29/721; 29/740; 356/614; 414/730

(58) Field of Classification Search ............ 29/740–743, 29/833–834, 705, 719–721; 356/614, 237.1–237.6; 414/331.18, 730, 752; 901/40, 46–47; 700/28, 700/29, 69, 177
See application file for complete search history.

(56) References Cited

U.S. PATENT DOCUMENTS

| | | | |
|---|---|---|---|
| 5,743,005 A * | 4/1998 | Nakao et al. .................... | 29/833 |
| 6,506,222 B2 * | 1/2003 | Minamitani et al. ......... | 29/25.01 |
| 6,999,184 B2 * | 2/2006 | Yakiyama et al. ............ | 356/614 |
| 7,047,632 B2 * | 5/2006 | Arikado ......................... | 29/832 |
| 7,062,334 B2 * | 6/2006 | Tanaka et al. .................. | 700/69 |
| 7,319,337 B2 * | 1/2008 | Sakata .......................... | 324/754 |

FOREIGN PATENT DOCUMENTS

| | | |
|---|---|---|
| JP | 5-308086 A | 11/1993 |
| JP | 10-12706 A | 1/1998 |
| JP | 2002-26041 A | 1/2002 |
| JP | 2003-51531 A | 2/2003 |
| JP | 2006-80105 A | 3/2006 |

* cited by examiner

*Primary Examiner* — Minh Trinh
(74) *Attorney, Agent, or Firm* — Studebaker & Brackett PC; Donald R. Studebaker

(57) ABSTRACT

A plurality of reference electronic components (M1, M2) marked in advance are identified and recognized, and the positions of the plurality of the reference electronic components (M1, M2) positioned in the vicinity of an electronic component to be taken out (2a) and component arrangement information in a wafer mapping file (MF) stored in a storage device (11f) are used to calculate the position of the electronic component to be taken out (2a).

4 Claims, 12 Drawing Sheets

FIG.4

(1,18):nnnnnnn1111nnnnnnn ← MF
(1,17):nnnnn1111111nnnnn
(1,16):nnn111111111111nnn
(1,15):nn1111111111111nn
(1,14):nn1111111111111nn
(1,13):n111111111111X111n
(1,12):n111111111111111n
(1,11):1111X11111111111
(1,10):1111111111111111
(1,9) :1111X1111111111
(1,8) :1111111111X1111111
(1,7) :n111111111111111
(1,6) :n1111111X11111111n
(1,5) :nn1111111111111n
(1,4) :nn111111111111nn
(1,3) :nnn11111111111nnn
(1,2) :nnnn111111111nnnn
(1,1) :nnnnnn111111nnnnnn ■ REFERENCE ELECTRONIC COMPONENT
☐ NO COMPONENT IS PRESENT
▦ COMPONENT IS PRESENT X1, Y1 POSITION OF REFERENCE ELECTRONIC COMPONENT M1
X2, Y2 POSITION OF REFERENCE ELECTRONIC COMPONENT M2
Xc, Yc TARGET ELECTRONIC COMPONENT 2a

ELECTRONIC COMPONENT TAKING OUT APPARATUS

TECHNICAL FIELD

The present invention relates to an electronic component taking out apparatus for taking out an electronic component from an electronic component assembly formed in a wafer.

BACKGROUND ART

In general, an electronic component taking out apparatus for taking out an electronic component from an electronic component assembly formed in a wafer includes a recognizer for recognizing an image obtained by photographing the electronic component assembly, and a component taking out device for taking out an electronic component from the electronic component assembly. The electronic component taking out apparatus refers to component arrangement information on the arrangement of components in the electronic component assembly to identify an electronic component to be taken out and then takes out the electronic component.

As an example of the electronic component taking out apparatus, the patent document 1 discloses a technology of a semiconductor manufacturing apparatus configured to identify and recognize a reference mark provided in advance on a wafer holding section that holds a wafer, such as an adhesive sheet, and calculate the position of an electronic component to be taken out based on the component arrangement information stored in storage device.

In the related art used in the semiconductor manufacturing apparatus described above, however, since the reference mark provided on the wafer holding section, such as an adhesive sheet, is used as a reference, the position of the electronic component calculated by the position of the reference mark and the component arrangement information deviates from the actual position of the electronic component when the electronic components are not uniformly arranged in the wafer in the first place or when the wafer holding section is formed of a sheet or any similar material and deformed due to heat or other causes. In this case, it is disadvantageously difficult to take out the electronic component with precision.
Patent Document 1: Japanese Patent Laid-Open Publication No. 05-308086

DISCLOSURE OF THE INVENTION

The present invention has been made in view of the problem described above. An object of the present invention is to provide an electronic component taking out apparatus which can take out an electronic component with precision from an electronic component assembly even when electronic components are not uniformly arranged in a wafer or a wafer holding section is deformed. Another object of the present invention is to provide a surface mounting apparatus and an electronic component taking out method.

To achieve the object, an electronic component taking out apparatus according to the present invention is configured to take out an electronic component from an electronic component assembly in which electronic components orderly arranged in a wafer has been diced and held on a wafer holding section. The electronic component taking out apparatus includes component taking out device for taking out an electronic component from the electronic component assembly, storage device for storing component arrangement information on the arrangement of the components in the electronic component assembly, controller for identifying an electronic component to be taken out from the electronic component assembly based on the component arrangement information and controlling the component taking out device to take out the electronic component, and recognizer for recognizing an image obtained by photographing the electronic component assembly held on the wafer holding section. The controller identifies and recognizes, among the electronic components in the wafer, a plurality of reference electronic components marked in advance to be distinguished from the other electronic components, and calculates the position of the electronic component to be taken out based on the positions of a plurality of the reference electronic components positioned in the vicinity of the electronic component to be taken out and the component arrangement information stored in the storage device.

Unlike a case where the position of an electronic component is calculated with reference to a reference mark provided on the wafer holding section, since the electronic component taking out apparatus operates with direct reference to the arrangement of a plurality of marked reference electronic components positioned in the vicinity of an electronic component to be taken out, in other word, the distorted arrangement, the electronic component can be taken out with precision from the electronic component assembly even when the electronic components are not arranged uniformly on the wafer or the wafer holding section is deformed.

A surface mounting apparatus according to the present invention includes the electronic component taking out apparatus described above, a board placement unit in which a board is placed, and a component mounting head unit having a head that sucks the electronic components. An electronic component taken out from the electronic component assembly by the component taking out device is transported to the board placement unit and mounted on the board by the component mounting head unit.

Since the surface mounting apparatus calculates the position of an electronic component to be taken out with direct reference to the arrangement of a plurality of marked reference electronic components positioned in the vicinity of an electronic component to be taken out, in other word, with direct reference to the distorted arrangement, the electronic component can be taken out with precision from the electronic component assembly even when the electronic components are not arranged uniformly on the wafer or the wafer holding section is deformed.

An electronic component taking out method according to the present invention recognizes an image of an electronic component assembly in which electronic components orderly arranged in a wafer has been diced and held on a wafer holding section, and allows a component taking out device to take out an electronic component from the electronic component assembly whose image has been recognized. The method includes a reference electronic component recognizing step of identifying and recognizing the positions of a plurality of reference electronic components positioned in the vicinity of an electronic component to be taken out, a position calculating step of calculating the position of the electronic component to be taken out based on the positions of the plurality of reference electronic components and component arrangement information on the arrangement of the electronic components orderly arranged in the wafer, and a component taking out step of controlling the component taking out device to take out the electronic component in the calculated position.

According to the electronic component taking out method, since the position of an electronic component to be taken out is calculated with direct reference to the arrangement of a plurality of marked reference electronic components positioned in the vicinity of an electronic component to be taken out, in other word, with direct reference to the distorted arrangement, the electronic component can be taken out with precision from the electronic component assembly even when the electronic components are not arranged uniformly on the wafer or the wafer holding section is deformed.

BRIEF DESCRIPTION OF THE DRAWINGS

FIG. 4 explains a wafer mapping file that is component arrangement information on the arrangement of the components in a wafer;

BEST MODE FOR CARRYING OUT THE INVENTION

Figure 1:
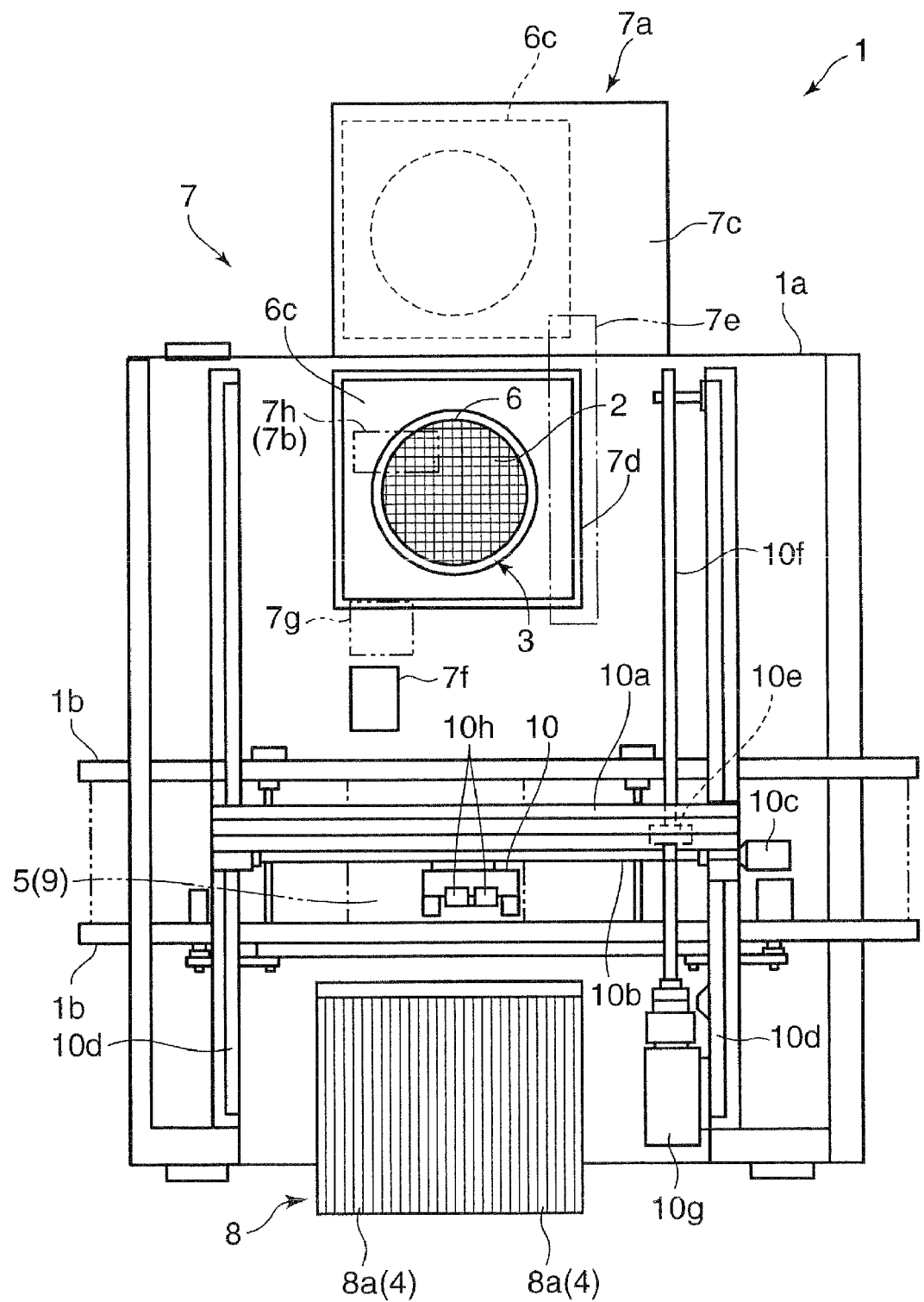
FIG. 1 is a plan view showing the configuration of a surface mounting apparatus including an electronic component taking out apparatus according to an embodiment of the present invention.
Figure 2:
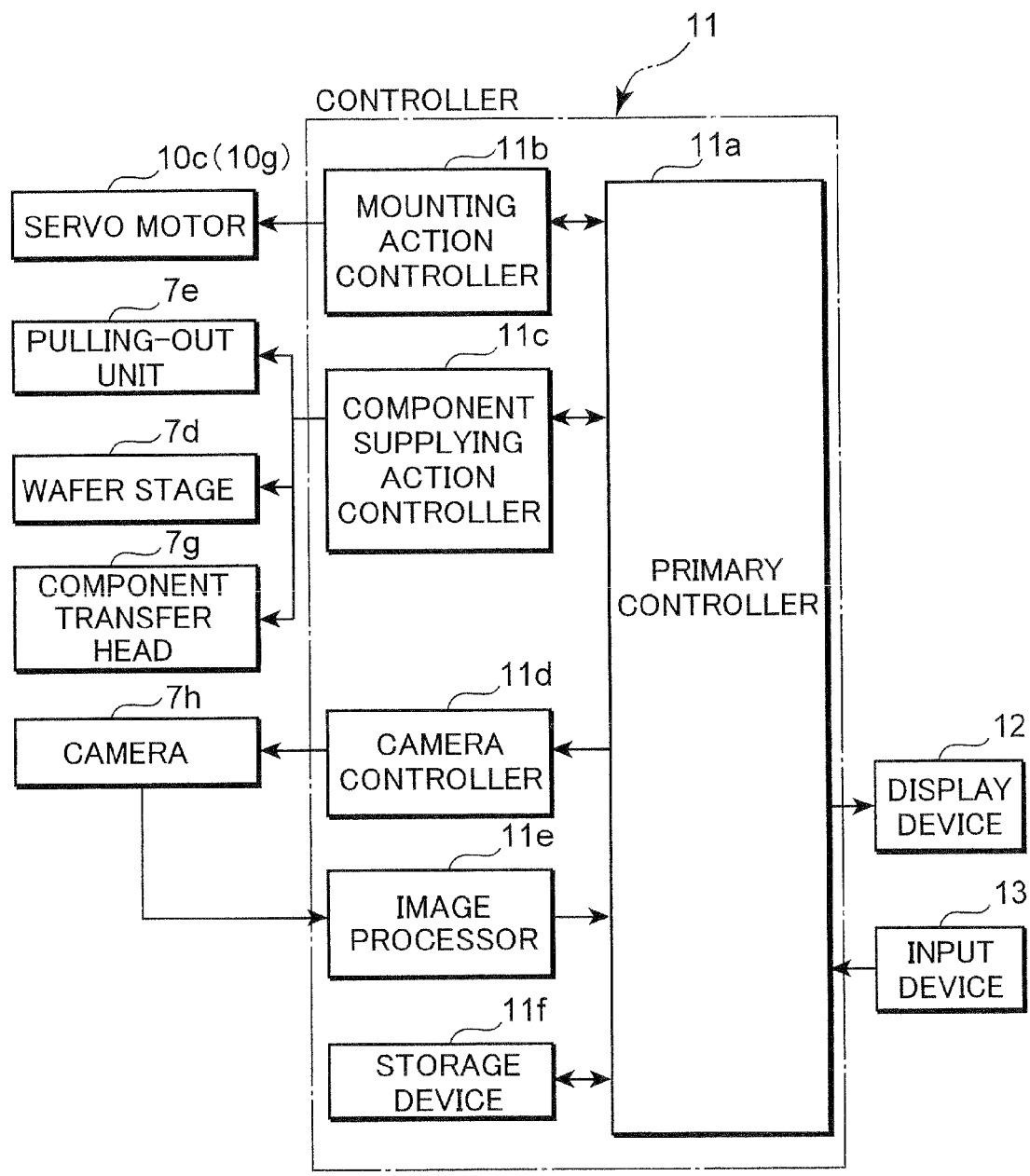
FIG. 2 is a block diagram showing a schematic configuration of a controller for controlling the surface mounting apparatus.
Figure 3:
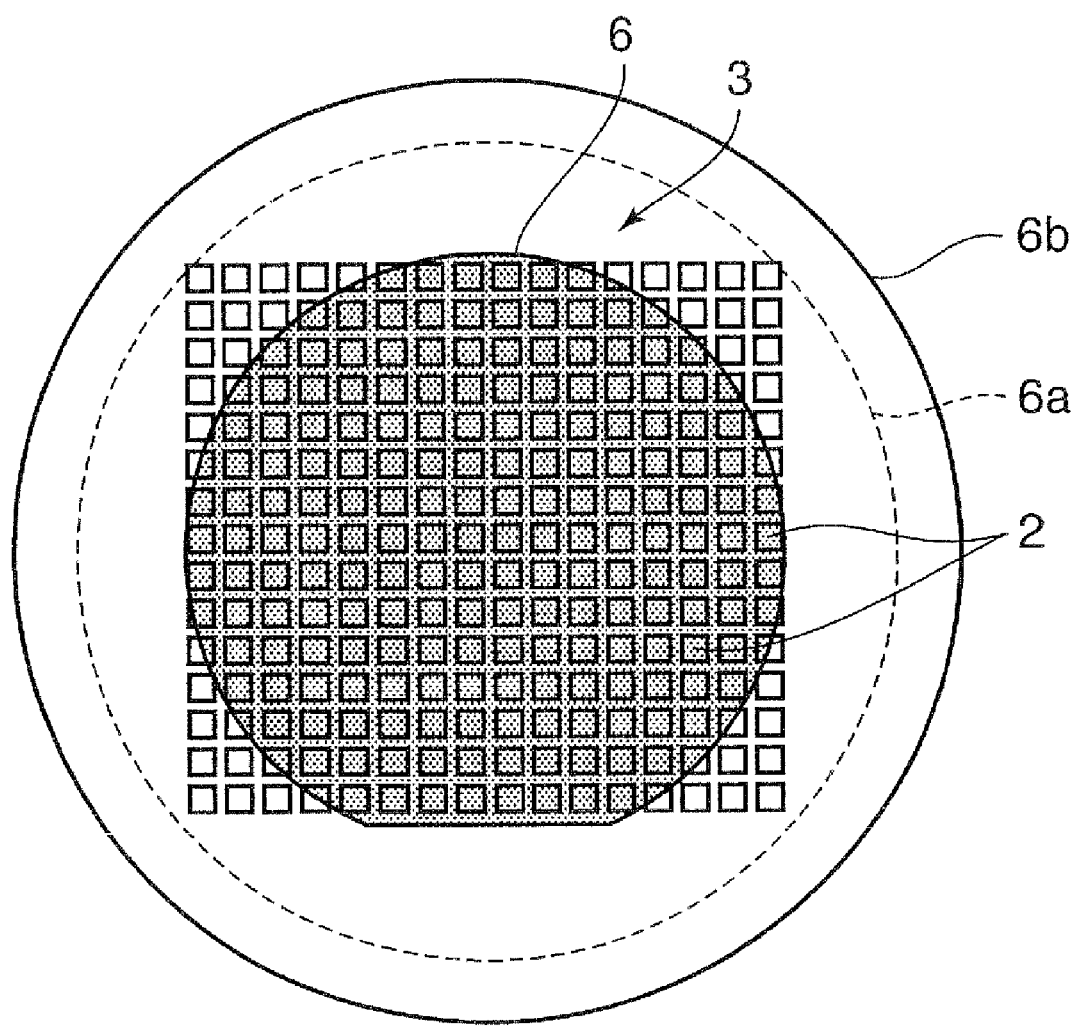
FIG. 3 is a plan view showing the arrangement of electronic components in a wafer.

A preferred embodiment of the present invention will be described below in detail with reference to the accompanying drawings. FIG. 1 is a plan view showing the configuration of a surface mounting apparatus 1 including an electronic component taking out apparatus 7 according to the embodiment of the present invention. FIG. 2 is a block diagram showing a schematic configuration of a controller 11 for controlling the surface mounting apparatus 1. FIG. 3 is a plan view showing the arrangement of electronic components 2 in a wafer 6.

As shown in FIG. 1, the surface mounting apparatus 1 according to the embodiment of the present invention includes an electronic component taking out apparatus 7 according to the present invention that supplies individual electronic components 2 from an electronic component assembly 3 that is a set of electronic components 2, such as bare chips; a packaged component supplying apparatus 8 that supplies packaged components 4, such as integrated circuits components, semiconductor packages, transistors, and capacitors, each of which housed in a casing made of ceramics or other materials or molded by resin or other materials; and a board placement unit 9 on which a board 5 comprised of a printed circuit board on which any of the electronic components 2 and packaged components 4 are mounted.

The surface mounting apparatus 1 further includes a component mounting head unit 10 that sucks any of the electronic components 2 and the packaged components 4 and transports them from the electronic component taking out apparatus 7 and the packaged component supplying apparatus 8 onto the board 5 in the board placement unit 9; and a controller 11 (FIG. 2) for controlling the electronic component taking out apparatus 7, the packaged component supplying apparatus 8, and the head unit 10.

The wafer 6 is a silicon wafer on which the electronic components 2 are orderly arranged, as shown in FIG. 3. The wafer 6, which is attached to a wafer holding section 6a comprised of an adhesive sheet, is diced, and the diced wafer 6 still attached to the wafer holding section 6a is placed in a wafer ring 6b. The wafer ring 6b is placed in a wafer holder 6c (FIG. 1).

The electronic component taking out apparatus 7 (FIG. 1) includes a component taking out device 7a for taking out an electronic component 2 from the diced electronic component assembly 3 held on the wafer holding section 6a, and a recognizer 7b for recognizing an image obtained by photographing the electronic component assembly 3.

The component taking out device 7a includes a wafer housing/elevator 7c that houses wafers 6, each of which placed on the wafer holder 6c, at multiple vertical levels; a wafer stage 7d disposed in front of the wafer housing/elevator 7c and movable in X-axis and Y-axis directions; a pulling-out unit 7e that pulls out any of the wafer holders 6c from the wafer housing/elevator 7c onto the wafer stage 7d; a transfer stage 7f positioned in the vicinity of conveyers 1b; and a component transfer head 7g that sucks an electronic component 2 from the wafer 6 on the wafer stage 7d at a predetermined pickup position and transfers it onto the transfer stage 7f. The wafer stage 7d and the component transfer head 7g are configured to take out an electronic component 2 from the electronic component assembly 3.

The recognizer 7b includes a wafer camera 7h that images from above the wafer 6 held on the wafer holder 6c placed on the wafer stage 7d; a camera controller lid (FIG. 2) in the controller 11; and an image processor 11e (FIG. 2). The wafer camera 7h, although not illustrated in detail, is movable between a predetermined photographing position and retract position, and moves to the retract position when not photographing components to avoid interference with the component transfer head 7g.

The packaged component supplying apparatus 8, which supplies the packaged components 4, includes a plurality of tape feeders 8a arranged in rows, each of the tape feeders 8a including a ratchet-type feeding mechanism to intermittently feed a tape from a reel, the tape housing and holding packaged components 4 at predetermined intervals. Although not illustrated in detail, an electronic component 4 is taken out from the tape fed from any of the tape feeders 8a into a component taking out section (not shown), where the packaged component 4 is picked up by the head unit 10.

The board placement unit 9 is a predetermined location set on the conveyors 1b disposed at a substantially central portion of the surface mounting apparatus. A board 5 stops at this position, and electronic components 2 and packaged components 4 are mounted thereon.

The head unit 10 mounts, on the printed circuit board 5, the electronic component 2 transferred onto the transfer stage 7f by the component transfer head 7g and the packaged component 4 delivered to the component taking out section (not shown) in the packaged component supplying apparatus 8. The head unit 10 can move above a base 1a in the X-axis direction (the direction in which the conveyors 1b move) and the Y-axis direction (the direction perpendicular to the X-axis).

The motion of the head unit 10 in the X-axis direction will be described below. A nut (not shown) provided in the head unit 10, a ball screw shaft 10b that is rotatably provided in a head unit supporting member 10a and engages the nut, and an X-axis servo motor 10c that rotates the ball screw shaft 10b are configured to move the head unit 10 in the X-axis direction along a guide member (not shown) provided in the head unit supporting member 10a.

The motion of the head unit 10 in the Y-axis direction will be described below. A nut 10e provided in the head unit supporting member 10a, a ball screw shaft 10f that engages the nut 10e, and a Y-axis servo motor 10g that rotates the ball screw shaft 10f are configured to move the head unit supporting member 10a in the Y-axis direction along a pair of rails 10d provided on the base 1a. The head unit 10 supported by the unit supporting member 10a can move in the Y-axis direction along with the unit supporting member 10a.

The head unit 10 includes at least one mounting head 10h for sucking a component. The head unit 10 is further equipped with, although not illustrated in detail, a lifting drive mechanism including a Z-axis motor for lifting and lowering the mounting head 10h in a Z-axis direction (vertical direction), and a rotary drive mechanism that rotates the mounting head 10h around an R-axis. The mounting head 10h includes a suction nozzle positioned at the lower end thereof and a passage that guides sucking negative pressure to the suction nozzle.

The controller 11, which controls the electronic component taking out apparatus 7, the packaged component supplying apparatus 8, and the head unit 10, includes primary controller 11a, mounting action controller 11b, component supplying action controller 11c, camera controller 11d, image processor 11e, and storage device 11f, as shown in FIG. 2. The controller 11 is connected to the servo motors 10c, 10g, the pulling-out unit 7e, the wafer stage 7d, the component transfer head 7g, the wafer camera 7h, a display device 12, such as a CRT and an LCD, and an input device 13, such as a keyboard.

The primary controller 11a controls actions of the surface mounting apparatus 1 in accordance with a mounting program stored in advance.

The mounting action controller 11b controls the X-axis servo motor 10c and the Y-axis servo motor 10g to mount a component on a board 5, and controls the lifting drive mechanism, the rotary drive mechanism, and other members provided in the head unit 10.

The component supplying action controller 11c controls the wafer stage 7d, the pulling-out unit 7e, the component transfer head 7g, and other members in the component taking out device 7a to carry out a component supplying action including pulling out any of the wafer holders 6c on which a wafer 6 is placed onto the wafer stage 7d, taking out an electronic component 2 from the wafer 6 on the wafer stage 7d, and transferring the electronic component 2 onto the transfer stage 7f. The component transferred onto the transfer stage 7f is picked up by the component mounting head unit 10, transported onto the board 5, and then mounted.

As the mounting action is repeated, the electronic components 2 arranged in the wafer 6 are successively taken out and mounted. In this process, the wafer stage 7d adjusts the position of the wafer 6, and the component transfer head 7g takes out the electronic components 2.

After the wafer holder 6c on which the wafer 6 is placed is pulled out onto the wafer stage 7d, but before the component transfer head 7g takes out any of the electronic components 2, the camera controller 11d controls the wafer camera 7h to image the wafer 6 in a predetermined photographing position. The image processor 11e then recognizes the image sent from the wafer camera 7h.

The recognizer 7b in the electronic component taking out apparatus 7 described above is configured to use the wafer camera 7h, the camera controller 11d, and the image processor 11e to image the wafer 6 and recognize the image.

The storage device 11f stores a wafer mapping file MF (FIG. 4) as component arrangement information on the arrangement of the components in the wafer 6.

Figure 5:
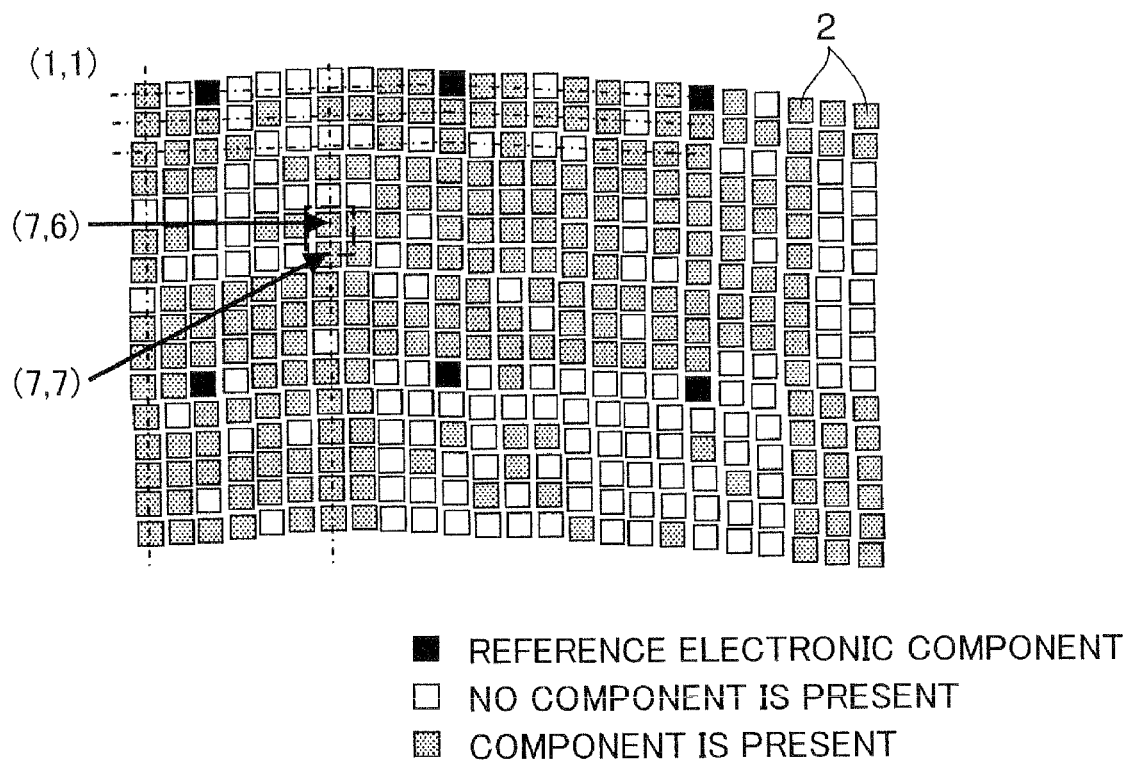
FIG. 5 explains the arrangement of reference electronic components.
Figure 6:
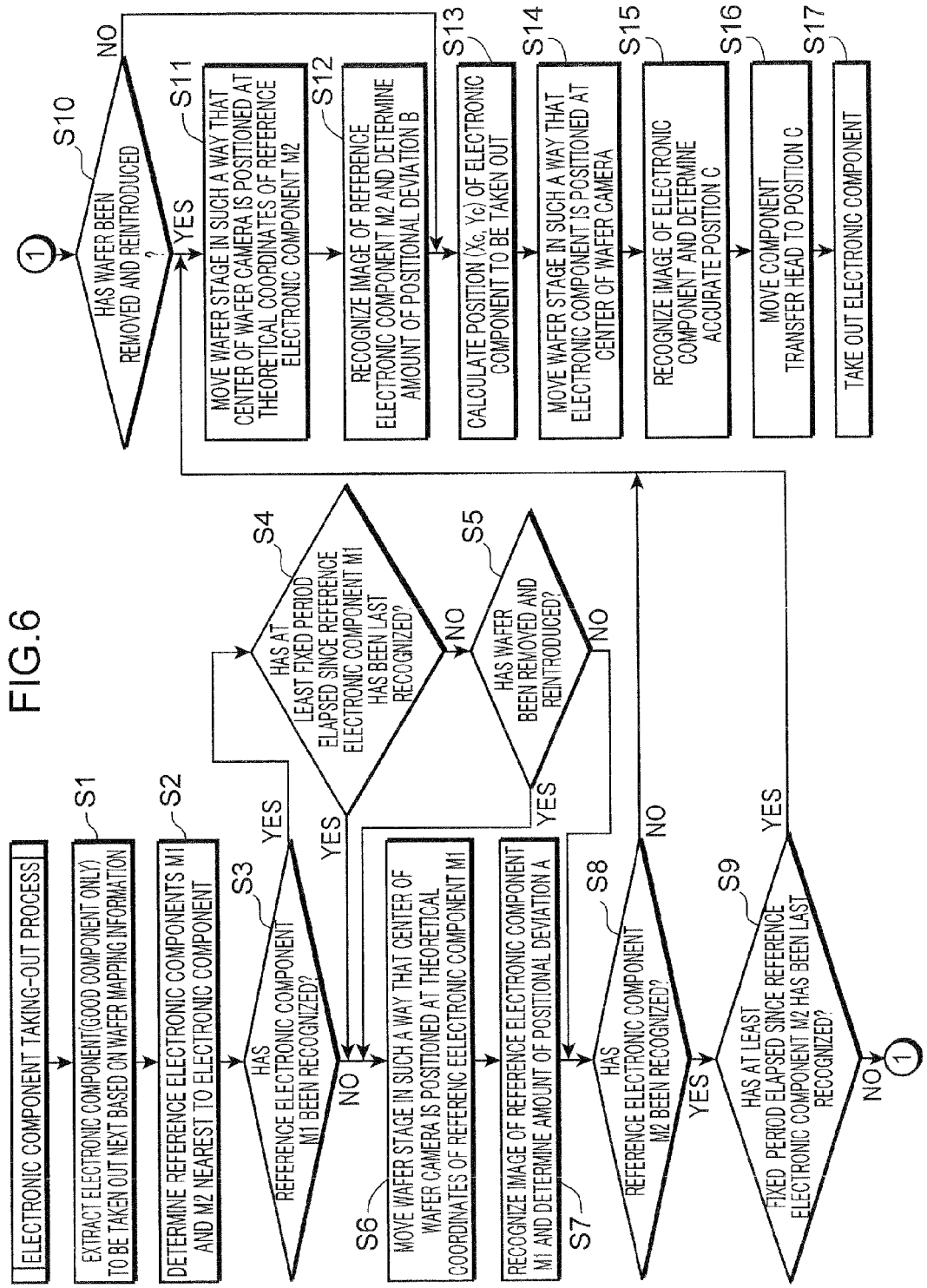
FIG. 6 is a flowchart showing how the electronic component taking out apparatus takes out an electronic component.

The operation of the surface mounting apparatus 1 according to the embodiment of the present invention will be described with reference to FIGS. 4 to 6. FIG. 4 explains the wafer mapping file MF as component arrangement information on the arrangement of the components in the wafer 6. FIG. 5 explains the arrangement of electronic components 2 and reference electronic components. FIG. 6 is a flowchart showing how the electronic component taking out apparatus 7 takes out an electronic component.

In the electronic component taking out apparatus 7, the controller 11 recognizes an image of the electronic component assembly 3 and allows the component taking out device 7a to take out an electronic component 2 from the electronic component assembly 3 recognized as an image.

As component arrangement information in the wafer mapping file MF, the address of each component is identified by specifying the row and column numbers, as shown in FIG. 4. A good component is labeled with "1", and a defective component is labeled with "x". An area where no component is present in a square region containing the wafer 6 is labeled with "n".

Although not illustrated in FIG. 4, in the electronic component assembly 3 in a wafer W, there are quite a few number of reference dies, such as a TEG (Test Element Group: evaluation devices dedicated to be used in a semiconductor device reliability test), each of which having a circuit pattern different from that of a typical electronic component 2. Information indicating the addresses of the TEG is also stored in the storage device 11f as part of the information in the wafer mapping file MF.

Further, in the present embodiment, as shown in FIG. 5, reference electronic components M1 and M2 used to identify and recognize the positions of the electronic components 2 are added to the information in the wafer mapping file MF.

The reference electronic components M1 and M2 are electronic components 2 each of which having a circuit pattern significantly different from those of typical electronic components 2 (good and defective components) and TEGs to the extent that the difference is readily identifiable, and arranged in a regular grid to form a matrix.

A target electronic component 2a to be taken out from the electronic component assembly 3 is identified based on the component arrangement information in the wafer mapping file MF, and the electronic component 2 is taken out.

Specifically, as shown in FIG. 6, an electronic component taking out method carried out by the controller 11 includes a reference electronic component recognizing process (steps S1 to S12), a position calculation process (step S13), and a component taking out process (steps S14 to S17).

The reference electronic component recognizing process (steps S1 to S12) is a process of identifying and recognizing the positions of a plurality of reference electronic components M1 and M2 positioned in the vicinity of an electronic component 2a to be taken out. First, in the step S1, a component to be taken out is extracted from good components based on the information in the wafer mapping file MF.

In the next step S2, reference electronic components M1 and M2 nearest to the component to be taken out are determined.

In the present embodiment, the positions of the reference electronic components M1 and M2 that have been once identified and recognized are stored, and the stored data is used in the following process to reduce the operation time. However, when the wafer 6 is removed and reintroduced or when time has elapsed and the distortion state of the wafer 6 changes (judged on a time basis), the records of the recognized reference electronic components M1 and M2 are deleted, and the identification and recognition process is carried out again.

Specifically, it is first judged in the step S3 whether the reference electronic component M1 has been recognized. When the result is NO, the control proceeds to the step S6, where the wafer stage 7d is moved in such a way that the center of the wafer camera 7h is positioned at the theoretical coordinates of the reference electronic component M1. The amount of deviation A in the position of the reference electronic component M1 is determined in the step S7, and the actual coordinates (X1, Y1) (unit: mm) are calculated. The control then proceeds to the step S8.

When the result in the step S3 is YES, that is, when the reference electronic component M1 has been recognized, the control proceeds to the step S4, and it is judged whether at least a fixed period has elapsed since the reference electronic component M1 has been last recognized (step S4) and whether the wafer 6 has been removed and reintroduced (step S5). When at least a fixed period has elapsed since the reference electronic component M1 has been last recognized, the position may have been shifted, whereas when the wafer 6 has been removed and reintroduced, the data before the wafer removal and reintroduction operation is no longer valid. Therefore, when any of the results in the steps S4 and S5 is YES, the control proceeds to the step S6, where the amount of deviation A in the position of the reference electronic component M1 is determined and the actual coordinates (X1, Y1) (unit: mm) are calculated. When both the results in the steps S4 and S5 are NO, the control proceeds to the step S8.

It is similarly judged in the step S8 whether the reference electronic component M2 has been recognized. When the result is NO, the control proceeds to the step S11, where the wafer stage 7d is moved in such a way that the center of the wafer camera 7h is positioned at the theoretical coordinates of the reference electronic component M2. The amount of deviation in the position of the reference electronic component M2 is then determined, and the actual coordinates (X2, Y2) (unit: mm) are calculated in the step S12.

When the result in the step S8 is YES, in other words, when the reference electronic component M2 has been recognized, it is judged whether at least a fixed period has elapsed since the reference electronic component M2 has been last recognized (step S9) and whether the wafer 6 has been removed and reintroduced (step S10). As in the case of the reference electronic component M1, when any of the results in the steps S9 and S10 is YES, the control proceeds to the step S11, where the amount of deviation B in the position of the reference electronic component M2 is determined and the actual coordinates (X2, Y2) (unit: mm) are calculated. When both the results in the steps S9 and S10 are NO, the control proceeds to the step S13.

The position calculation process (step S13) is a process of calculating the position of the electronic component 2a to be taken out based on the positions of the plurality of reference electronic components M1 and M2 and the component arrangement information, contained in the wafer mapping file MF, on the arrangement of the electronic components 2 orderly arranged in the wafer 6.

Figure 7:
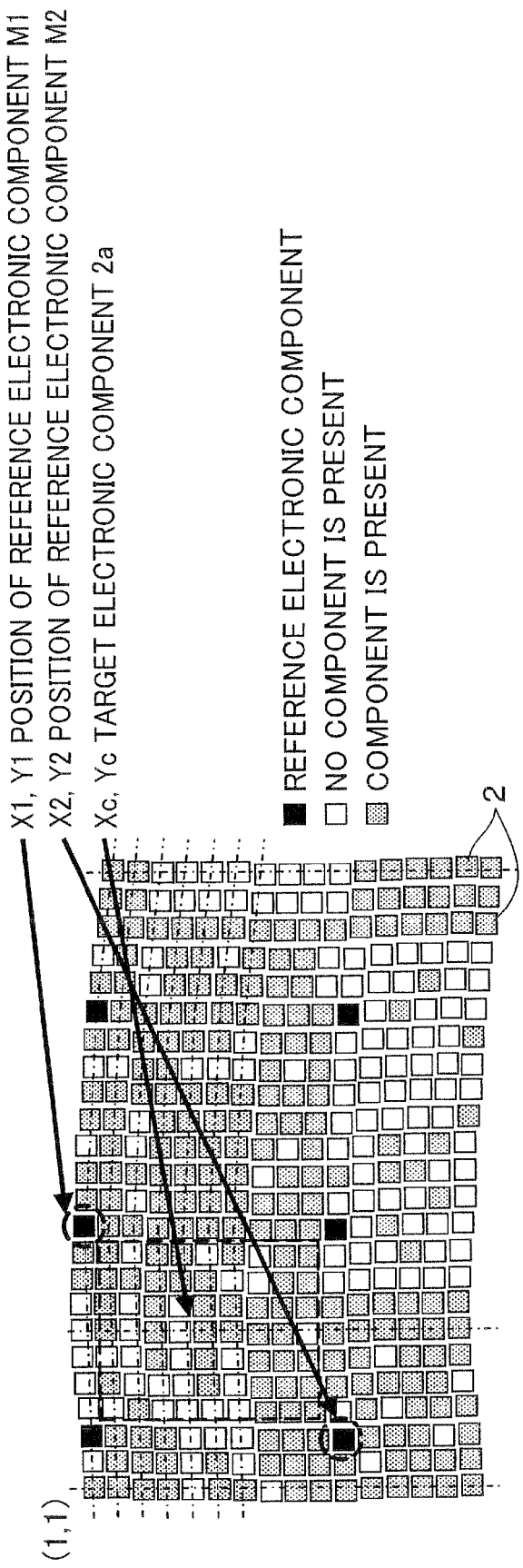
FIG. 7 explains the relative relationship between the position of an electronic component to be taken out and the positions of reference electronic components, and shows a case where the reference electronic components are present on the lower left side and the upper right side of the electronic component to be taken out.
Figure 8:
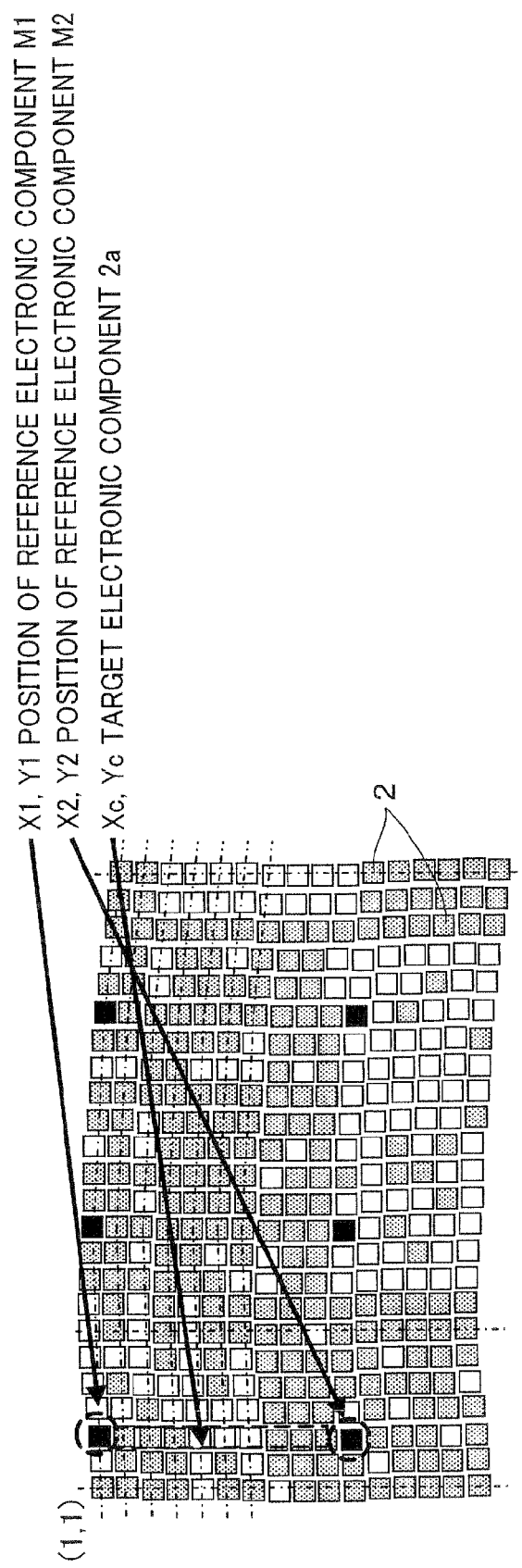
FIG. 8 explains the relative relationship between the position of an electronic component to be taken out and the positions of reference electronic components, and shows a case where the reference electronic components are present on the column containing the electronic component to be taken out and on the upper and lower sides thereof.
Figure 9:
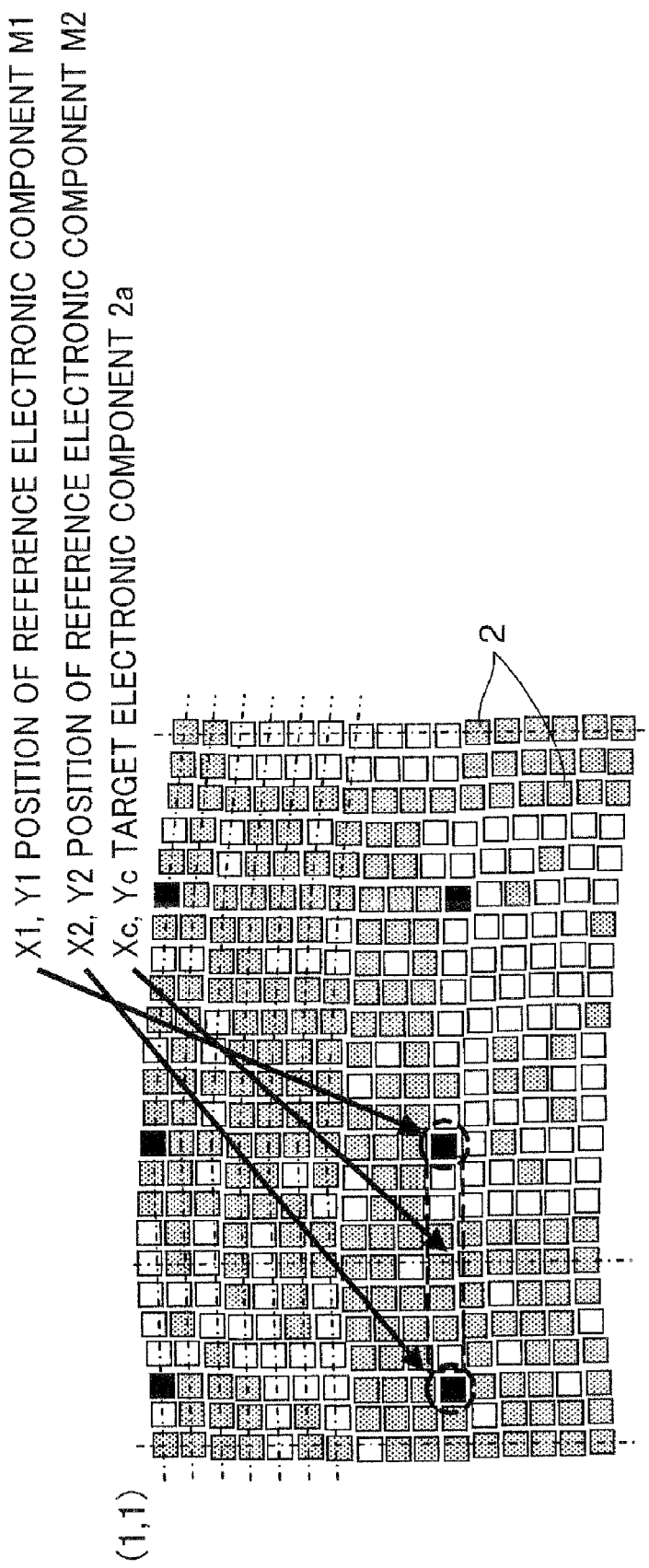
FIG. 9 explains the relative relationship between the position of an electronic component to be taken out and the positions of reference electronic components, and shows a case where the reference electronic components are present on the row containing the electronic component to be taken out and on the right and left sides thereof.
Figure 10:
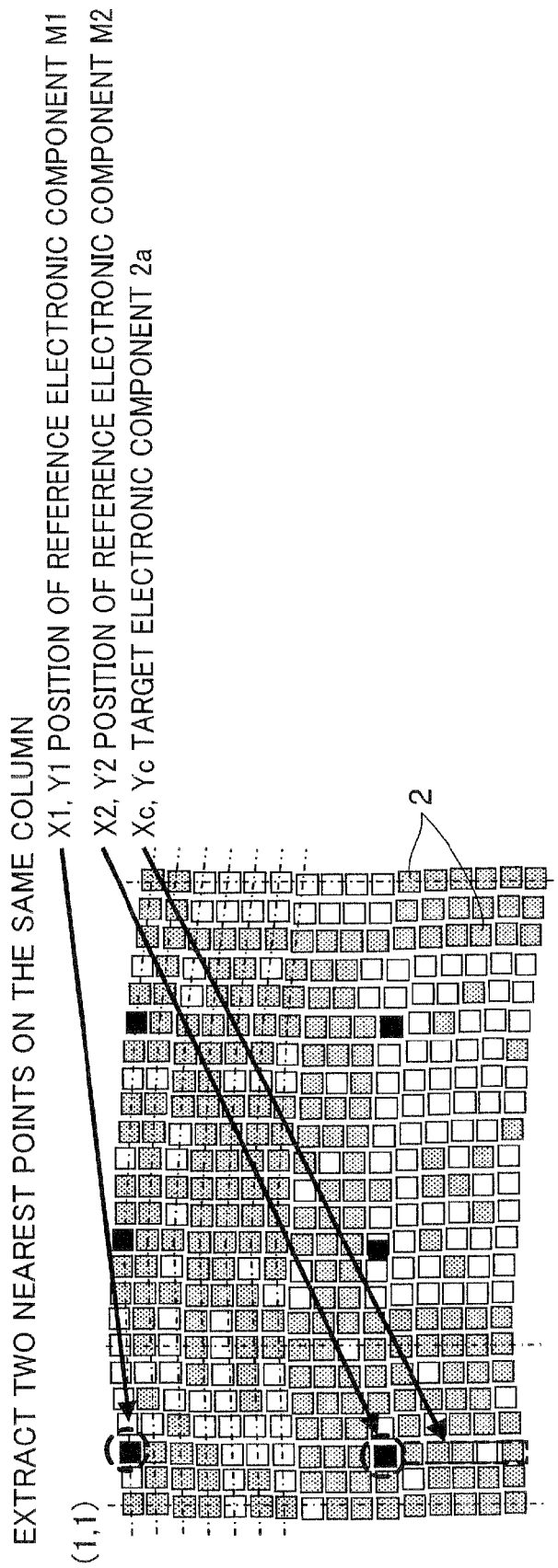
FIG. 10 explains the relative relationship between the position of an electronic component to be taken out and the positions of reference electronic components, and shows a case where the reference electronic components are present on the row containing the electronic component to be taken out and only on the upper side thereof.
Figure 11:
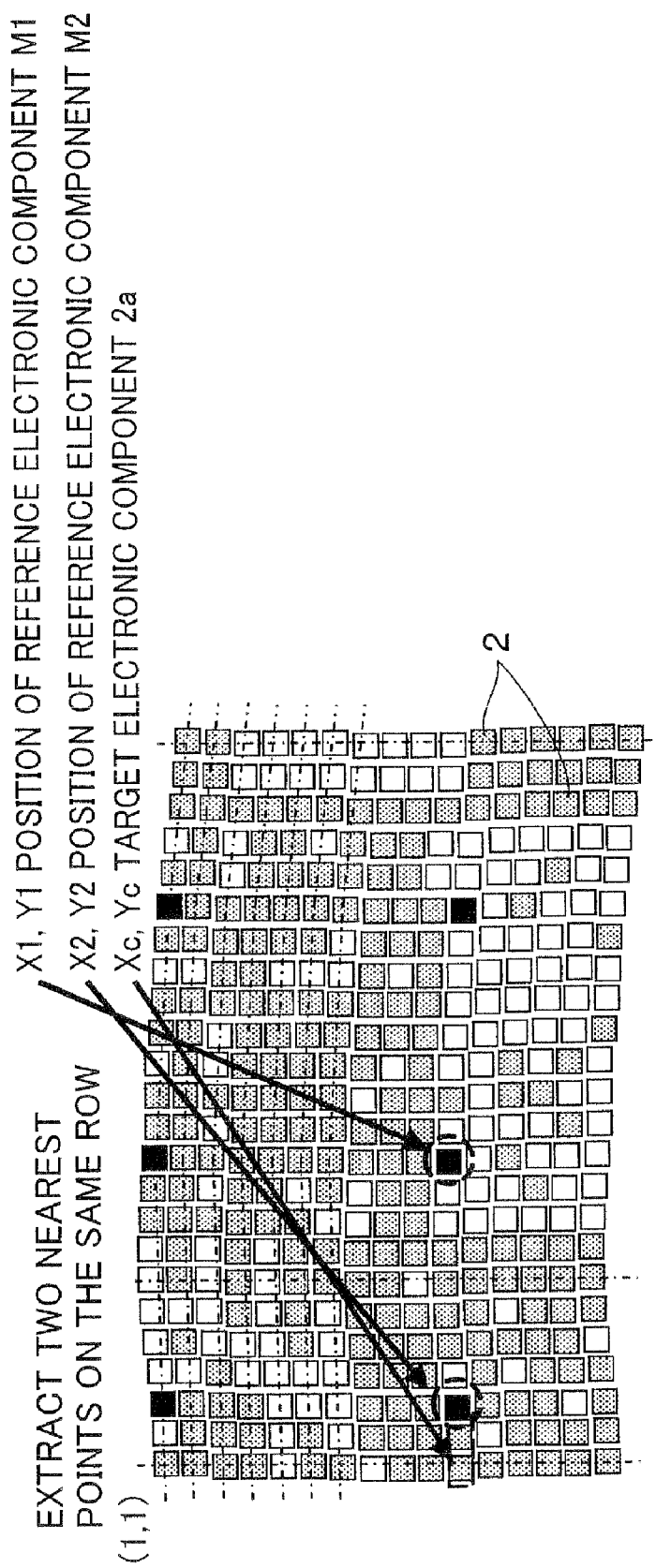
FIG. 11 explains the relative relationship between the position of an electronic component to be taken out and the positions of reference electronic components, and shows a case where the reference electronic components are present on the row containing the electronic component to be taken out and only on the right side thereof.
Figure 12:
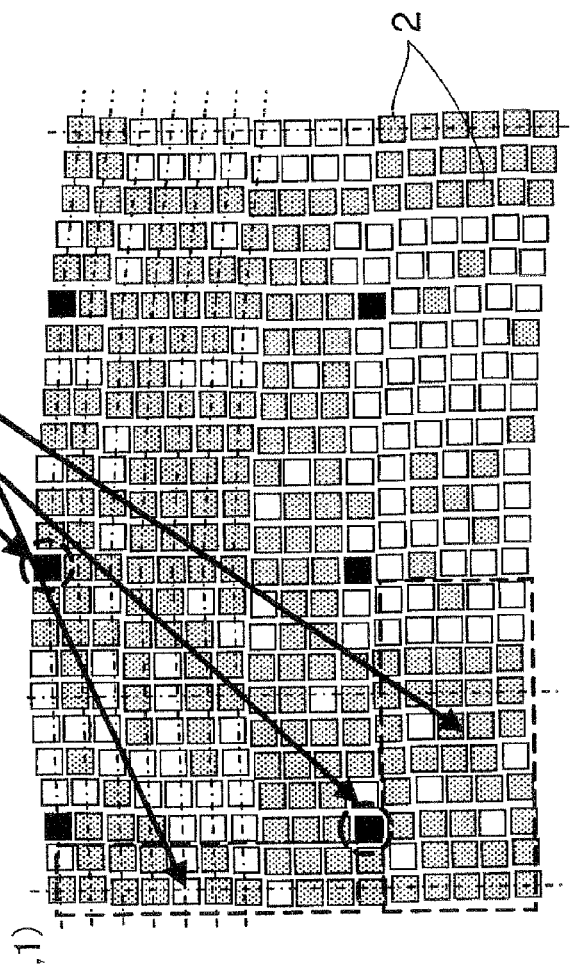
FIG. 12 explains the relative relationship between the position of an electronic component to be taken out and the positions of reference electronic components, and shows a case where the reference electronic components are not present on the lower left side or the upper right side of the electronic component to be taken out.

The position calculation process (step S13) will be described in detail with reference to FIGS. 7 to 12. Each of FIGS. 7 to 12 explains the relative relationship between the position of an electronic component 2a to be taken out and the positions of the reference electronic components M1, M2. FIG. 7 shows a case where the reference electronic components M1 and M2 are present on the lower left side and the upper right side of the electronic component 2a to be taken out, respectively. FIG. 8 shows a case where the reference electronic components M1 and M2 are present on the column containing the electronic component 2a to be taken out and on the upper and lower sides thereof, respectively. FIG. 9 shows a case where the reference electronic components M1 and M2 are present on the row containing the electronic component 2a to be taken out and on the right and left sides thereof, respectively. FIG. 10 shows a case where the reference electronic components M1 and M2 are present on the row containing the electronic component 2a to be taken out and only on the upper side thereof. FIG. 11 shows a case where the reference electronic components M1 and M2 are present on the row containing the electronic component 2a to be taken out and only on the right side thereof. FIG. 12 shows a case that is different from the cases shown in FIGS. 7 to 11 and where the reference electronic components M1 and M2 are not present on the lower left side or the upper right side of the electronic component 2a to be taken out. In FIGS. 7 to 12, it is assumed that the actual coordinates and the matrix coordinates of the upper left electronic component 2 is (0, 0) (unit: mm) and (1, 1), respectively, and the values of the parameters increase rightward or downward.

In any of the above cases, since the information on the arrangement of electronic components 2a to be taken out and the information on the arrangement of the two reference electronic components M1 and M2 are known, the position of an electronic component 2a to be taken out can be interpolated or extrapolated by referring to the above arrangement information and using the positions of the two reference electronic components M1 and M2.

Specifically, let (Xc, Yc) (unit: mm) and (MXc, MYc) (unit: integer) be the actual coordinates and the matrix coordinates of the electronic component 2a to be taken out, (X1, Y1) (unit: mm) and (MX1, MY1) (unit: integer) be the actual coordinates and the matrix coordinates of M1, which is one of the reference electronic components, and (X2, Y2) (unit: mm)

and (MX2, MY2) (unit: integer) be the actual coordinates and the matrix coordinates of M2, which is the other reference electronic component. Xc and Yc are then expressed by the following general expression:

$$Xc=X1+(X2-X1)\times(MXc-MX1)/(MX2-MX1)$$

$$Yc=Y1+(Y2-Y1)\times(MYc-MY1)/(MY2-MY1)$$

Referring back to FIG. 6, the component taking out process (steps S14 to S17) is a process of controlling the component taking out device 7a to take out the electronic component 2a in the calculated position thereof. In the step S14, the wafer stage 7d is moved in such a way that the center of the wafer camera 7h is positioned at the corrected position of the component. In the step S15, an image of the component is recognized, and the accurate position C is determined. In the step S16, the component transfer head 7g is moved to the position C, and the component is taken out (step S17).

When all the specified good components are taken out, the component transfer head 7g returns to an initial position.

As described above, the surface mounting apparatus 1 includes the storage device 11f that stores the wafer mapping file MF representing the component arrangement information on the arrangement of the components in the electronic component assembly 3, and the controller 11 is configured to calculate the position of the electronic component 2a to be taken out based on the positions of a plurality of reference electronic components M1 and M2 positioned in the vicinity of an electronic component 2a to be taken out and the component arrangement information in the wafer mapping file MF stored in the storage device 11f.

As described above, unlike a case where the position of an electronic component 2 is calculated with reference to a reference mark provided on the wafer holding section 6a, since the electronic component taking out apparatus 7 according to the embodiment of the present invention calculates the position of an electronic component 2a to be taken out with direct reference to the arrangement of a plurality of marked reference electronic components M1 and M2 positioned in the vicinity of the electronic component 2a to be taken out, in other word, with direct reference to the distorted arrangement, the electronic component taking out apparatus 7 can take out an electronic component 2 with precision from the electronic component assembly 3 even when electronic components 2 are not arranged uniformly in a wafer 6 or the wafer holding section 6a is deformed.

Further, in the above configuration, since the reference electronic components M1 and M2 are arranged in a regular grid pattern to form a matrix, the position of an electronic component 2a to be taken out is more readily calculated with reference to the reference electronic components M1 and M2.

Moreover, in the above configuration, when electronic components 2 having different circuit patterns are formed in a wafer 6, the electronic components 2 having different circuit patterns can be reference electronic components M1 and M2. It is therefore necessary to mark only the reference electronic components M1 and M2, whereby cost can be reduced.

The embodiment described above is presented only as a specific preferred example of the present invention, and the present invention is not limited to the above embodiment.

For example, the electronic components 2 are not limited to bare chips, but may be other integrated circuits.

The board 5 is not limited to a printed circuit board. Electronic components may be mounted on a board having a lead-frame-based circuit.

The wafer holding section 6a is not limited to an adhesive sheet. A variety of wafer holding sections 6a can be employed as long as they can hold a diced electronic component assembly 3.

In the electronic component taking out apparatus 7, the wafer housing/elevator 7c, the wafer stage 7d, the pulling-out unit 7e, the transfer stage 7f, the component transfer head 7g, the wafer camera 7h, and other members are not necessarily limited to the illustrated configurations. The design of the above members can be changed in a variety of ways as long as the electronic component taking out apparatus 7 includes the component taking out device 7a for taking out an electronic component 2 from a diced electronic component assembly 3 held on the wafer holding section 6a and the recognizer 7b for recognizing an image obtained by photographing the electronic component assembly 3.

The board placement unit 9 is not necessarily configured to stop the board 5 on the conveyers 1b, but can be configured in such a way that electronic components 2 and packaged components 4 are mounted on the moving board 5.

Further, the configuration of the head unit 10 is not necessarily limited to the illustrated configuration. The design of the head unit 10 can be changed in a variety of ways as long as the head unit 10 at least transports electronic components 2 from the electronic component taking out apparatus 7 onto a board 5 in the board placement unit 9 and mounts the electronic components 2.

The packaged component supplying apparatus 8 does not necessarily include the tape feeders 8a and supply semiconductor packages, transistors, and capacitors. The design of the packaged component supplying apparatus 8 can be changed in a variety of ways in terms of the type of components to be supplied and the configuration of the apparatus.

In addition to the above, it is of course possible to change the design described above in a variety of ways within the scope of the claims of the present invention.

The present invention described above is summarized as follows:

Specifically, an electronic component taking out apparatus according to the present invention is configured to take out an electronic component from an electronic component assembly in which electronic components orderly arranged in a wafer has been diced and held on a wafer holding section. The electronic component taking out apparatus includes component taking out device for taking out an electronic component from the electronic component assembly, storage device for storing component arrangement information on the arrangement of the components in the electronic component assembly, controller for identifying an electronic component to be taken out from the electronic component assembly based on the component arrangement information and controlling the component taking out device to take out the electronic component, and recognizer for recognizing an image obtained by photographing the electronic component assembly held on the wafer holding section. The controller identifies and recognizes, among the electronic components in the wafer, a plurality of reference electronic components marked in advance to be distinguished from the other electronic components, and calculate the position of the electronic component to be taken out based on the positions of a plurality of the reference electronic components positioned in the vicinity of the electronic component to be taken out and the component arrangement information stored in the storage device.

Unlike a case where the position of an electronic component is calculated with reference to a reference mark provided on the wafer holding section, since the electronic component taking out apparatus operates with direct reference to the arrangement of a plurality of marked reference electronic components positioned in the vicinity of an electronic component to be taken out, in other word, with direct reference to the distorted arrangement, the electronic component can be taken out with precision from the electronic component assembly even when the electronic components are not arranged uniformly on the wafer or the wafer holding section is deformed.

The reference electronic components may be preferably arranged in a regular grid pattern in the wafer to form a matrix.

In the above configuration, since the reference electronic components are arranged in a regular grid pattern to form a matrix, the position of the electronic component to be taken out is more readily calculated with reference to the reference electronic components.

The reference electronic components are marked to show that their circuit patterns differ from those of the other electronic components, and the recognizer is preferably configured to identify and recognize the reference electronic components whose circuit patterns differ from those of the other electronic components.

In the above configuration, when electronic components having different circuit patterns are formed in the wafer, the electronic components having different circuit patterns can be reference electronic components. It is therefore necessary to mark only the reference electronic components, whereby cost can be reduced.

A surface mounting apparatus according to the present invention includes the electronic component taking out apparatus described above, a board placement unit in which a board is placed, and a component mounting head unit having a head that sucks the electronic components. An electronic component taken out from the electronic component assembly by the component taking out device is transported to the board placement unit and mounted on the board by the component mounting head unit.

Since the surface mounting apparatus calculates the position of an electronic component to be taken out with direct reference to the arrangement of a plurality of marked reference electronic components positioned in the vicinity of an electronic component to be taken out, in other word, with direct reference to the distorted arrangement, the electronic component can be taken out with precision from the electronic component assembly even when the electronic components are not arranged uniformly on the wafer or the wafer holding section is deformed.

An electronic component taking out method according to the present invention recognizes an image of an electronic component assembly in which electronic components orderly arranged in a wafer has been diced and held on a wafer holding section, and allows a component taking out device to take out an electronic component from the electronic component assembly whose image has been recognized. The method includes a reference electronic component recognizing step of identifying and recognizing the positions of a plurality of reference electronic components positioned in the vicinity of an electronic component to be taken out, a position calculating step of calculating the position of the electronic component to be taken out based on the positions of the plurality of reference electronic components and component arrangement information on the arrangement of the electronic components orderly arranged in the wafer, and a component taking out step of controlling the component taking out device to take out the electronic component in the calculated position.

According to the electronic component taking out method, since the position of an electronic component to be taken out is calculated with direct reference to the arrangement of a plurality of marked reference electronic components positioned in the vicinity of an electronic component to be taken out, in other word, with direct reference to the distorted arrangement, the electronic component can be taken out with precision from the electronic component assembly even when the electronic components are not arranged uniformly on the wafer or the wafer holding section is deformed.

INDUSTRIAL APPLICABILITY

As described above, the electronic component taking out apparatus, the surface mounting apparatus, and the electronic component taking out method according to the present invention are configured to take out an electronic component with precision from an electronic component assembly formed in a wafer or any other suitable board, and useful in a technical field of semiconductor manufacturing apparatus.

The invention claimed is:

1. An electronic component taking out apparatus configured to take out an electronic component from an electronic component assembly in which electronic components orderly arranged in a wafer has been diced and held on a wafer holding section, the electronic component taking out apparatus comprising:
   a component taking out device to take out an electronic component from the electronic component assembly;
   a storage device to store component arrangement information on the arrangement of the components in the electronic component assembly;
   a controller to identify an electronic component to be taken out from the electronic component assembly based on the component arrangement information and controlling the component taking out device to take out the electronic component; and
   a recognizer to recognize an image obtained by photographing the electronic component assembly held on the wafer holding section,
   wherein the controller further configured to identify and recognize, among the electronic components in the wafer, a plurality of reference electronic components marked in advance to be distinguished from the other electronic components, and to calculate the position of the electronic component to be taken out based on the positions of a plurality of the reference electronic components positioned in the vicinity of the electronic component to be taken out and the component arrangement information stored in the storage device,
   said controller further configured to identify and recognize said plurality of reference electronic component marked and to recalculate the position of the electronic component to be taken out based on the positions of said plurality of reference electronic components and the stored component arrangement information, when at least a fixed period of time has elapsed since the plurality of reference electronic components have been previously identified and recognized.

2. The electronic component taking out apparatus according to claim 1, wherein the reference electronic components are arranged in a regular grid pattern in the wafer to form a matrix.

3. The electronic component taking out apparatus according to claim 2, wherein the reference electronic components have circuit patterns different from circuit patterns of the other electronic components, and the recognizer is configured to identify and recognize the reference electronic components marked whose circuit patterns differ from the circuit patterns of the other electronic components.

4. The electronic component taking out apparatus according to claim 1, wherein the reference electronic components have circuit patterns different from circuit patterns of the other electronic components, and the recognizer is configured to identify and recognize the reference electronic components marked whose circuit patterns differ from the circuit patterns of the other electronic components.

* * * * *